April 11, 1961 E. A. PASCHAL 2,979,667

AUTOMATIC VOLUME CONTROL AMPLIFIER

Filed May 1, 1958 3 Sheets-Sheet 1

INVENTOR.
EDWIN A. PASCHAL
BY
Robert H. Himes
AGENT.

INVENTOR.
EDWIN A. PASCHAL,
BY Robert H. Hines
AGENT.

April 11, 1961 E. A. PASCHAL 2,979,667

AUTOMATIC VOLUME CONTROL AMPLIFIER

Filed May 1, 1958 3 Sheets-Sheet 3

INVENTOR.
EDWIN A. PASCHAL,
BY
Robert H. Himes
ATTORNEY.

United States Patent Office 2,979,667

Patented Apr. 11, 1961

2,979,667

AUTOMATIC VOLUME CONTROL AMPLIFIER

Edwin A. Paschal, Anaheim, Calif., assignor to Hughes Aircraft Company, Culver City, Calif., a corporation of Delaware Filed May 1, 1958, Ser. No. 734,380

4 Claims. (Cl. 330—19)

The present invention relates to a transistor amplifier device having automatic volume control and more particularly to a transistor amplifier incorporating a Zener diode as an alternating current load impedance of one of the transistor amplifier stages thereby to achieve automatic volume control action which makes use of the full impedance range of the diode.

Several general methods of obtaining automatic volume control action that depend upon a non-linear element to provide controllable gain are in common use. The simplest of these methods takes advantage of the non-linear input characteristic of a junction transistor, the gain of the stage being controlled by changing the direct-current emitter current. This method, however, makes bias stabilization of the controlled stage impossible, and its use not preferred as it is necessary to stabilize the transistors in the alternating-current amplifier portion of the apparatus to fulfill requirements of reliability necessary for some types of electronic equipment. Alternatively, a control element external to the audio amplifier can be used either as a variable attenuator or as a variable feedback element. While the latter of these two methods results in less distortion, its use is not desired inasmuch as the range of automatic volume control which can be produced is substantially less than the obtainable impedance range of the element itself. In that the automatic volume control range desired to be incorporated in the device of the present invention is rather wide and distortion is not a major problem, this latter method does not represent the most economical solution.

It is therefore an object of the present invention to provide an automatic volume control transistor amplifier of improved design.

Another object of the present invention is to provide an automatic volume control transistor amplifier which employs a Zener-type diode as an alternating current load on a transistor amplifier stage.

Still another object of the present invention is to provide a transistor amplifier that includes a transistor stage adapted to utilize the full range of the variable impedance element to achieve automatic volume control.

According to the present invention, the disclosed audio amplifier comprises a plurality of transistor stages, the first stage of which achieves automatic volume control which is accomplished by utilizing a Zener diode for a load in a manner to hold the load signal voltage into a second stage to a predetermined peak value. A third stage constitutes a high impedance source for the quiescent current for the first stage thereby making it possible to use the full impedance range of the Zener diode for the automatic volume control action. The second stage brings the signal to a desired output level, which signal is fed to a fourth stage which is an "emitter follower" so as to present a low impedance to a load and to a rectifier employed in the automatic volume control portion of the circuitry.

To produce the automatic volume control action, the output voltage from the fourth stage is rectified and applied to an error detector along with a reference voltage. The error detector provides a direct-current output signal that is approximately proportional to the difference between the two input voltages which output signal is used to drive a direct-current amplifier which in turn drives current through the Zener diode to control its dynamic resistance in a manner to produce an output signal of substantially constant amplitude.

The above-mentioned and other features and objects of this invention and the manner of obtaining them will become more apparent by reference to the following description taken in conjunction with the accompanying drawings, wherein.

Figure 1:
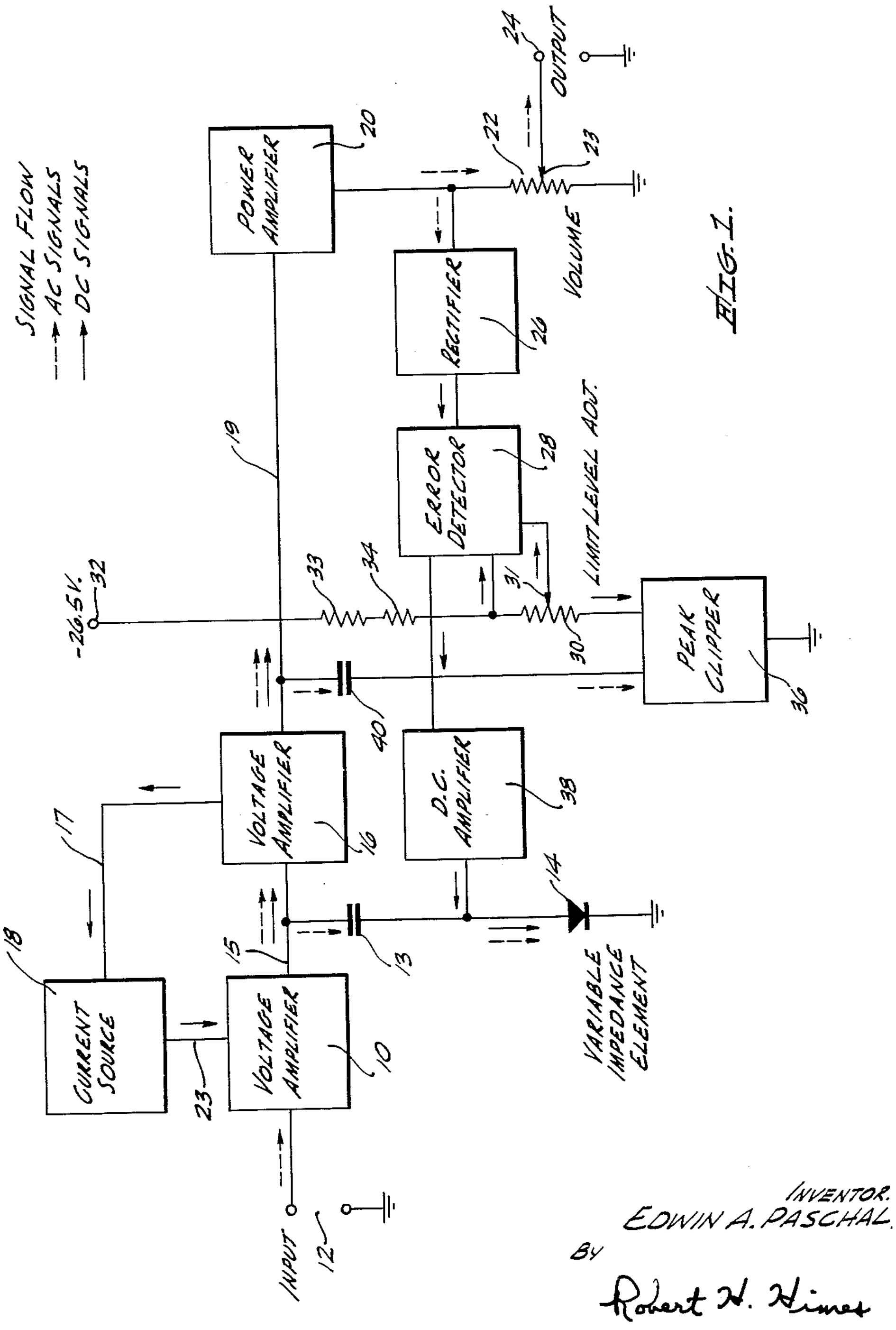
Fig. 1 is a block diagram of a preferred embodiment of the device of the present invention.

Referring now to Fig. 1 of the drawings, there is shown a block diagram of a preferred embodiment of the transistor amplifier of the present invention. More particularly, the amplifier of the present invention comprises a transistor voltage amplifier stage 10 adapted to accept signals applied to an input terminal 12 and which amplifier stage 10 has a variable impedance output circuit which includes a capacitor 13 and a Zener diode 14 connected in series from the output thereof to ground. The output from transistor voltage amplifier stage 10 is fed over a lead 15 to transistor voltage amplifier stage 16 which, in turn, feeds a direct-current over a lead 17 to a transistor current source 18, which source 18 in turn provides a high impedance current source for the transistor voltage amplifier 10. In addition, the output of transistor voltage amplifier stage 16 is connected over a lead 19 to the input of transistor power amplifier stage 20, the output of which is applied across a potentiometer 22 to ground. An adjustable tap 23 of potentiometer 22 provides means for adjusting the level of the output signal, which signal is coupled to an output terminal 24.

In order to produce the automatic volume control action, the signal which appears across the output potentiometer 22 is applied to a rectifier 26, the direct current output of which is applied to an error detector 28 along with a reference signal which appears across the more negative extremity of a potentiometer 30 and an adjustable tap 31 thereof. The reference signal is developed by the flow of current from a negative power supply terminal 32, maintained at a negative potential of the order of −26.5 volts with respect to ground, through voltage dividing resistors 33, 34, the potentiometer 30 and the biasing circuits of a peak clipper 36 to ground. The error detector 28 produces an output signal which is proportional to the difference between the reference signal received from adjustable tap 31 of the potentiometer 30 in the voltage divider network and the rectified signal from the rectifier 26. This output signal from the error detector 28 is amplified by a direct current amplifier 38 to produce a direct-current signal of negative polarity which signal is applied to the junction between Zener diode 14 and capacitor 13, thereby to cause "reverse" direct-current to flow through the Zener diode 14 to determine the dynamic impedance of the output circuit of transistor voltage amplifier 10. Lastly, the peak clipper 36 is coupled to the output of voltage amplifier 16 through a capacitor 40 and functions in a manner to place an absolute limit on peaks of output voltage appearing on lead 19 so as to avoid objectionable bursts of output amplitude before the "AVC" action occurs. This peak voltage limit may, for example, be of the order of ±1.1 volts; the length of the time delay between application of an input transient and compensation by the AVC action is 0.1 second to 1 second.

Figure 3:
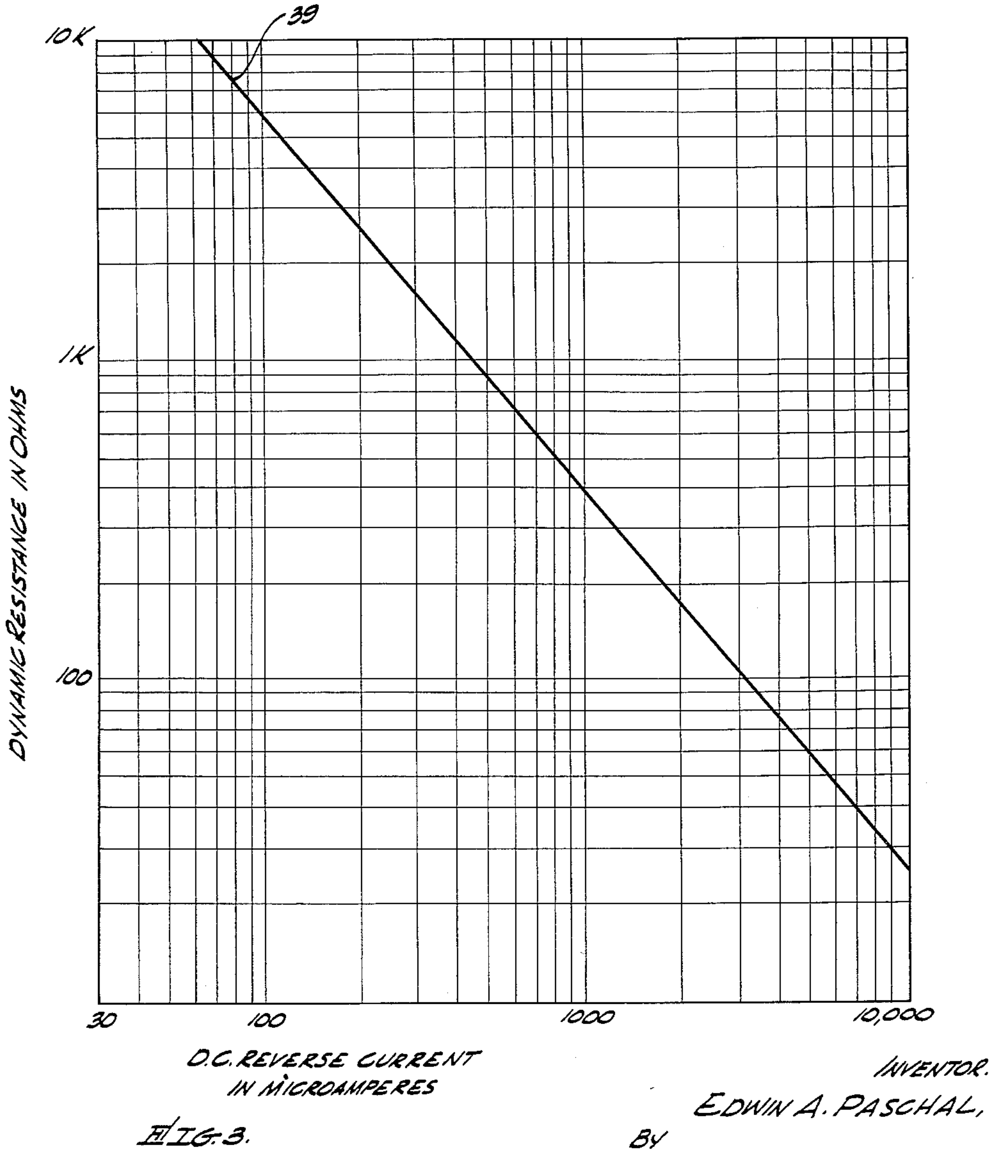
Fig. 3 shows the dynamic resistance characteristics of a particular Zener diode.

Prior to describing a more detailed embodiment of the present invention, reference will first be made to Fig. 3 which illustrates the dynamic resistance characteristic of a Zener diode of a type known commercially as 1N466–2. In general the Zener diode 14 of the amplifier of the present invention as specified above is poled so that the direct-current signal current flows through it in the "reverse" or high-resistance direction. Also, a minimum magnitude of current is generated by D.C. amplifier 38 so that reverse flow of current through the Zener diode 14 normally exceeds the so-called "Zener" point although the range of operating points may include regions on both sides of the knee or "Zener" point of the reverse characteristic. In general however, the Zener diode 14 is operated in the "zener control region," whereby the voltage drop across the diode will remain substantially constant irrespective of variations of current flow therethrough. Thus, an increase in the flow of inverse current through the Zener diode 14 results in a decrease in both the dynamic and static resistance thereof. In particular, as shown in Fig. 3, a characteristic 39 shows the manner in which the dynamic or small alternating-current resistance decreases in magnitude for increases in reverse current for a Zener diode type 1N466–2. That is, for an increase in reverse current from 60 to 10,000 microamperes the dynamic resistance decreases from 10,000 to 25 ohms. Also, examination of characteristic 39 indicates that this decrease is logarithmic and, hence, is ideally suited to control the decibel level of the output signal of the disclosed amplifier.

Figure 2:
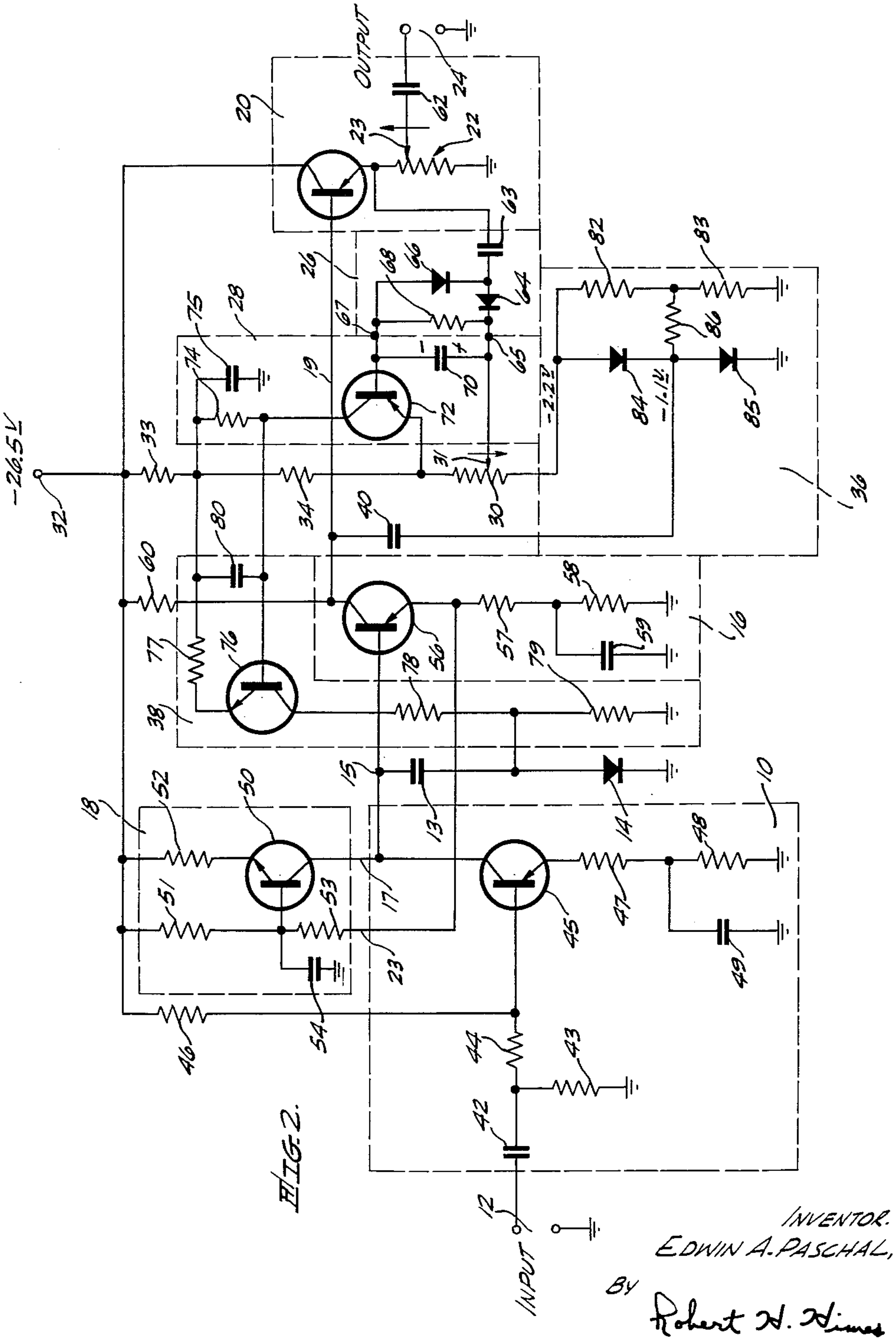
Fig. 2 shows a schematic circuit diagram of the device of Fig. 1.

To explain more clearly the automatic volume control amplifier of the present invention, reference is now made to Fig. 2 of the drawings where there is illustrated a detailed schematic circuit diagram of the device. A signal impressed on input terminal 12 is applied to the transistor voltage amplifier stage 10 through a capacitor 42 to a 500 ohm input circuit which comprises a resistor 43 connected from the capacitor 42 to ground, a resistor 44 connected from the capacitor 42 to the base of a transistor 45 and a resistor 46 connected from the base of the transistor 45 to the negative power supply terminal 32. The resistors 43, 44 and 46, in addition to forming an input circuit, also form a voltage divider which almost wholly determines the potential of the base of transistor 45. In addition, resistors 47 and 48 are connected in series combination from the emitter of transistor 45 to ground, resistor 48 being shunted by a capacitor 49. Since essentially the same voltage which appears on the base of transistor 45 appears on the emitter, the quiescent current through the transistor 45 is virtually independent of the characteristics of the transistor itself. Both resistors 47, 48 contribute to bias stabilization, but the capacitor 49 prevents the resistor 48 from introducing alternating current degeneration into the circuit. The negative feedback produced by the resistor 47, on the other hand, reduces the effect of variation of the characteristics of transistor 45 on the voltage gain of the stage 10.

Automatic volume control action is obtained by loading the collector of transistor 45 with the diode 14. Also, as the dynamic impedance of diode 14 is dependent on its direct current state, it must be isolated from the audio amplifier by the capacitor 13. In that the gain of transistor stage 10 is directly proportional to the magnitude of the impedance of its load, the gain can be made directly proportional to the dynamic resistance of diode 14 provided that other resistances to ground appearing at the collector of transistor 45 can be kept high in comparison to the resistance of the diode 14. In that an ordinary fixed resistance load for transistor 10 would be much too low to allow utilization of the full range of the dynamic resistance of the diode 14, a transistor 50 of stage 18 is employed to return the quiescent direct current of transistor 45 to the negative power supply terminal 32 while presenting the extremely high alternating-current impedance to the collector of transistor 45. The direct current through transistor 50 of stage 18 is made a function of its collector potential under arrangement of resistors 51, 52 and 53, resistor 51 being connected from the negative power supply terminal 32 to the base of transistor 50, resistor 52 being connected from the terminal 32 to the emitter of transistor 50, and resistor 53 being connected from the base of transistor 50 to the emitter of a transistor 56 of the transistor voltage amplifier stage 16. Thus, adequate operating potential for the collectors of both transistors 45, 50 is insured. It is to be noted that the voltage divider made up of resistors 51, 53 is made fairly "stiff" without materially reducing the alternating current impedance presented to the collector of transistor 45 by connecting resistor 53 not to the collector of transistor 45, but rather to the emitter of transistor 56.

The alternating-current impedance at the emitter of transistor 56 is relatively low, but the potential of this emitter follows that of the collectors of transistors 45, 50 which would produce negative voltage feedback. A capacitor 54 connected from the base of transistor 50 to ground prevents this negative voltage feedback from being effective at signal frequencies and destroying alternating-current gain.

The second amplifier stage, that is, transistor voltage amplifier stage 16, operates as a conventional common emitter amplifier. Quiescent current is determined by the base voltage and the resistance of resistors 57, 58 which are connected in series combination from its emitter to ground. Resistor 57 provides negative feedback to minimize the effect of transistor parameter variation on dynamic gain and also maintains a high input resistance for transistor voltage amplifier stage 10. Resistor 58, on the other hand, is bypassed to ground by a capacitor 59, whereby current flow through the resistor 58 produces very little negative feedback. The collector load for transistor 56 is the parallel combination of the input resistance of the emitter follower stage 20 together with that of resistor 60 connected from its collector to the negative power supply terminal 32.

Transistor stage 20 operates as an emitter follower into the rectifier circuit 26 and a load which includes the potentiometer 22 which is tapped by the variable tap 23 to provide manual volume control. The tap 23 is coupled through a capacitor 62 to the output terminal 24 where the signal is available for use by an external utilization device. The collector of the output transistor of stage 20 is connected directly to the negative power supply terminal 32.

Output voltage is sampled at the emitter of the output transistor of stage 20 whereby it is at this point that the automatic volume control action attempts to maintain a constant signal level. In that only alternating-current information is of interest, a capacitor 63 is employed to block the direct-current voltage of the emitter of the output transistor. The capacitor 63 is coupled to the rectifier 26, which rectifier includes a diode 64 connected from the capacitor 63 to a terminal 65 and poled so as to conduct current away from the capacitor 63; a diode 66 connected from the capacitor 63 to a terminal 67 and poled in a manner to conduct current towards the capacitor 63; and a resistor 68 connected between the terminals 65, 67. The diodes 64, 66, and resistor 68 form a voltage doubler rectifier, whereby the capacitor 63 also prevents flow of direct-current from the rectifier back through the potentiometer 22. In operation, rectified voltage builds up across the resistor 68 and is filtered by a capacitor 70 which is connected across the terminals 65, 67, the polarity of the potential which appears on terminal 65 being positive with respect to that which appears on terminal 67.

The error detector 28 includes a transistor 72 which accepts the output signal from the rectifier 26 by means of a connection from the base thereof to the terminal 67. A reference voltage for the error detector 28 is obtained between the tap 31 of the potentiometer 30 and the negative extremity thereof, the potentiometer 30 being a portion of a voltage divider across the negative power supply. In particular, the more negative extremity of potentiometer 30 is connected to the emitter of transistor 72 and the variable tap 31 to the terminal 65. Thus, the reference voltage appears between the variable tap 31 of the potentiometer 30 and the emitter of transistor 72, whereas the output signal information, i.e., the output of the rectifier 26, is applied between the variable tap 31 and the base of transistor 72. A load for the transistor 72 of error detector 28 is provided by a resistor 74 connected from the collector of transistor 72 to the junction between resistors 33, 34. This junction is, in turn, bypassed ground by a capacitor 75.

In operation, in the case where the output signal level increases, the rectifier 26 produces a larger direct-current signal across the capacitor 70, whereby the base of transistor 72 is driven more negative with respect to the potential level at the variable tap 31 of potentiometer 30. Thus, inasmuch as the emitter of the transistor 72 is maintained negative by an amount equal to the reference voltage with respect to the potential level at the tap 31, the emitter becomes more positive with respect to the potential of its base whereby increased current flows through the transistor 72. This increased current produces a larger potential drop across the load resistor 74. The capacitor 75 connected from the junction between load resistor 74 and the resistors 33, 34 to ground prevents feedback to other parts of the system. The direct-current amplifier 38 is driven by the error detector 28 and, in the case of an increase in output signal, forces an increase in reverse current through the Zener diode 14. Increased reverse current through the diode 14 lowers its dynamic resistance and thus lowers the overall gain of the amplifier. To accomplish this, the direct current amplifier 38 includes a transistor 76, the base of which receives the signal developed across the load resistor 74 of the error detector 28. The emitter of transistor 76 is connected through a resistor 77 to the junction of resistors 33, 34 and the collector connected through the serial combination of resistors 78, 79 to ground. The junction between resistors 78, 79 is connected to the junction between Zener diode 14 and the capacitor 13. The function of resistor 78 in the collector circuit of the transistor 76 is to limit power dissipation therein. Resistor 79, on the other hand, provides a path to ground for the leakage current of transistor 76 so that it need not flow through the Zener diode 14 and thus limit the maximum resistance of the diode.

It is to be noted that in order to decrease the maximum power dissipation in the direct current amplifier stage 38, the emitter load, i.e. resistor 77, of transistor 76 and the collector load, i.e. resistor 74, of transistor 72 are not returned to the negative power supply terminal 32 but rather are returned to the junction of resistors 33, 34 in the voltage divider which has the additional effect of improving the automatic volume control action. For example, under a large signal condition, the currents in transistors 72, 76 are at their maximum, and these currents combine to flow through resistor 33. Thus, the voltage drop across resistor 33 increases, and the voltage drop across resistors 30, 34 of the voltage divider correspondingly decrease; in particular, the reference voltage decreases. This decrease in the reference voltage allows the feedback loop to come to an equilibrium condition with a smaller output signal than if the reference voltage had remained constant. A converse effect occurs under a minimum signal condition, the net result being a compression of the range of output voltage by a given range of input. This is actually an introduction of positive feedback into the direct current portion of the feedback loop, and precautions against oscillation are necessary. First, an alternating current counterpart of this positive feedback is prevented by the presence of capacitor 75. At frequencies below those for which this capacitor is effective, large degeneration in the alternating current amplifier is assured by using the small emitter bypass capacitor 59 across the resistor 58 in the transistor voltage amplifier stage 16.

Also, in that rectifier 26 is of the halfwave voltage-doubler type, there is some ripple which appears across its output at the terminals 65, 67. Even though this ripple is fed into the alternating current amplifier degeneratively, by the time it is amplified by the error detector 28 and the direct current amplifier 38, it is of sufficient amplitude that it can cause considerable distortion of the signal. In order to minimize this effect, a capacitor 80 is connected from the base of transistor 76 to the junction of resistors 33, 34, thereby to provide further filtering action.

The time constant of the automatic volume control action is determined largely by the charge and discharge times of capacitor 13. This accounts for the large difference in time constant for increasing and decreasing signal levels. When the signal has suddenly increased, transistor 76 of direct current amplifier 38 is actively drawing as much current as it can from the junction of Zener diode 14, resistor 79 and capacitor 13, whereby capacitor 13 discharges rather rapidly. When the signal has suddenly decreased, on the other hand, transistor 76 of direct-current amplifier 38 is cut off, leaving capacitor 13 to discharge rather slowly through resistor 79 and the high dynamic impedance of the Zener diode 14.

In addition to the above, peak clipping is provided by the peak clipper 36 which is coupled to the collector of transistor 56 of transistor voltage amplifier stage 16 through the capacitor 40. Peak clipper 36 comprises the series combination of resistors 82, 83 connected from the more positive extremity of the potentiometer 30 to ground, diodes 84, 85 connected from the more positive extremity of potentiometer 30 to ground, the diodes 84, 85 being poled in the same direction and in a manner such that no current normally flows therethrough. Further, a resistor 86 of substantially greater resistance than the resistors 82, 83 is connected from the common junction between resistors 82, 83 to the junction between the diodes 84, 85, the latter junction also being connected to the coupling capacitor 40. It may be noted that resistors 82, 83 are a portion of the voltage divider which also includes resistors 33, 34 and the potentiometer 30. The value of the resistors 82, 83 is chosen so that the potential, for example, at the more positive extremity of the potentiometer 30 is —2.2 volts with respect to ground, and the potential at the junction between resistors 82, 83 is —1.1 volts with respect to ground. Thus, when the magnitude of the signal appearing on lead 19 between the collector of transistor 56 and the base of the output transistor of stage 20 exceeds ±1.1 volts, the signal will either be shorted to ground through the diode 85 in the case of a positive excursion, or through the series combination of the diode 84 and the resistors 82, 83 in the case of a negative excursion.

It will be understood that the circuit specifications of the automatic volume control amplifier of the invention may vary according to the design for any particular application. The following circuit specifications are included, by way of example only, as suitable for an amplifier having a frequency response that is at least 300 to 3500 cycles per second and with harmonic distortion within this range that is less than 10%:

| | |
|---|---|
| Transistor voltage amplifier stage **10**: | |
| Capacitor **42** | 50 microfarads. |
| Resistor **43** | 560 ohms. |
| Resistor **44** | 1,000 ohms. |
| Transistor **45** | Type 2N113. |
| Resistor **46** | 3,300 ohms. |
| Resistor **47** | 470 ohms. |
| Resistor **48** | 2,200 ohms. |
| Capacitor **49** | 30 microfarads. |
| Variable impedance load: | |
| Zener diode **14** | Type 1N466–2. |
| Capacitor **13** | 50 microfarads. |
| Transistor voltage amplifier stage **16**: | |
| Transistor **56** | Type 2N113. |
| Resistor **57** | 510 ohms. |
| Resistor **58** | 6,800 ohms. |
| Capacitor **59** | 2 microfarads. |
| Resistor **60** | 3,300 ohms. |
| Current-source stage **18**: | |
| Transistor **50** | Type 2N183. |
| Resistor **52** | 1,000 ohms. |
| Resistor **51** | 10,000 ohms. |
| Resistor **53** | 22,000 ohms. |
| Capacitor **54** | 20 microfarads. |
| Transistor power amplifier stage **20**: | |
| Output transistor | Type MN25. |
| Potentiometer **22** | 1,000 ohms. |
| Output capacitor **62** | 50 microfarads. |
| Rectifier **26**: | |
| Diodes **64** and **66** | Type 1N67A. |
| Resistor **68** | 10,000 ohms. |
| Capacitor **70** | 15 microfarads. |
| Error detector **28**: | |
| Transistor **72** | 2N113. |
| Resistor **74** | 10,000 ohms. |
| Capacitor **75** | 100 microfarads |
| Voltage divider and peak clipper **36**: | |
| Resistor **33** | 220 ohms. |
| Resistor **34** | 750 ohms. |
| Potentiometer **30** | 100 ohms. |
| Resistors **82** and **83** | 51 ohms. |
| Resistor **86** | 33,000 ohms. |
| Capacitor **40** | 20 microfarads. |
| Direct current amplifier **38**: | |
| Transistor **76** | Type 2N183. |
| Resistor **77** | 170 ohms. |
| Resistor **78** | 1,000 ohms. |
| Resistor **79** | 68,000 ohms. |
| Capacitor **80** | 4 microfarads. |

It is, of course, apparent that many changes may be made in the above-described automatic volume control amplifier and many apparently widely different embodiments may be made without departing from the spirit and scope of the present invention. In view of this, it is to be understood that all matter contained in the above description and shown in the accompanying drawings shall be interpreted as illustrative of the invention and is not to be construed as limitations thereon.

What is claimed is:

1. An automatic volume control amplifier comprising a first transistor having a first base, a first collector and a first emitter, said first base being responsive to signals to be amplified; a capacitor and Zener diode connected in series combination from said first collector to a point maintained at a substantially fixed potential, said Zener diode being poled in a manner to allow conventional current flow therethrough from said capacitor to said point maintained at said substantially fixed potential; a second transistor having a second base, a second emitter and a second collector, said second base being connected to said first collector of said first transistor; a source of negative potential relative to said substantially fixed potential; a first resistor connected from said second collector to said source thereby to provide a load impedance whereby an output signal is developed thereacross; a voltage divider circuit connected from said source to said point maintained at said substantially fixed potential, said voltage divider circuit including in series combination a second resistor at the extremity thereof adjacent to said source and a third predetermined resistor at an intermediate portion thereof for providing a direct-current reference voltage of predetermined amplitude; means responsive to said output signal and said reference voltage for producing a direct-current signal of an amplitude proportional to the difference in amplitudes between said output signal and said reference voltage; and a third transistor having a third base, a third collector and a third emitter, said third base being responsive to said direct-current signal, said third collector being connected through a leakage resistor to said point maintained at said substantially fixed potential,, said third collector also being connected to the junction between said Zener diode and said capacitor thereby causing said direct-current signal to flow through said Zener diode in the reverse direction thereby to automatically control the amplitude of said output signal, and said third emitter being connected to the junction between said second resistor and the remainder of said voltage divider thereby to compress the range of output voltages for a given range of signals to be amplified.

2. The automatic volume control amplifier as defined in claim 1 which additionally includes a fourth transistor including a fourth base, a fourth collector and a fourth emitter, said fourth collector being connected to said first collector of said first transistor; a fifth resistor connected from said source to said fourth base; a sixth resistor connected from said fourth base to said second emitter; and a capacitor connected from said fourth base to said point maintained at said substantially fixed potential, whereby said fourth transistor provides a high impedance current source for said first transistor.

3. An automatic volume control amplifier comprising a first amplifier stage adapted to receive a signal to be amplified and having a Zener-type diode for a load, the dynamic impedance of said Zener-type diode being progressively less for an increasing flow of reverse direct-current therethrough, the gain of said first amplifier stage being dependent upon the impedance of said load; a second amplifier stage responsive to the signal developed across said load of said first amplifier stage for producing an output signal; means for providing a direct-current reference voltage of predetermined amplitude; means responsive to said output signal and said reference voltage for producing a direct-current signal of an amplitude proportional to the difference in amplitudes of said output signal and said reference voltage; and means for directing the flow of said direct-current signal through said Zener-type diode in a reverse direction thereby to automatically control the volume of said output signal.

4. An automatic volume control amplifier comprising an amplifier stage including a first transistor having a first base, a first emitter and a first collector, said first base being responsive to signals to be amplified; a Zener-type diode coupled from said first collector to a point maintained at a substantially fixed potential thereby to provide a load for said first transistor, the gain of said amplifier stage being dependent upon the impedance of said load; a second transistor having a second base, a second emitter and a second collector, said second base being coupled to said first collector of said first transistor and said second collector being connected through a first resistor, to a point maintained at a substantially fixed potential thereby to provide a load for developing an output signal thereacross; a third transistor having a third base, a third emitter and a third collector, said third collector being connected to said first collector of said first transistor; second and third resistors connected from said third base of said third transistor and from said third emitter, respectively, to sources of direct-current potential; a capacitor connected from said third base to a point maintained at a substantially fixed potential; a fourth resistor connected from said third base to said second emitter of said second transistor thereby to provide a high impedance current source for said first transistor; means for providing a direct-current reference voltage of a pedetermined amplitude; means responsive to the output signal developed across said first resistor and said reference voltage for producing a direct-current signal having an amplitude proportional to the difference in amplitudes between said output signal and said reference voltage; and means for directing said direct-current signal through said Zener-type diode in a reverse direction thereby to determine the impedance of said load of said amplifier stage and thereby automatically control the amplitude of said output signal.

References Cited in the file of this patent

UNITED STATES PATENTS

| | | |
|---|---|---|
| 1,833,750 | Kendall | Nov. 24, 1931 |
| 1,993,860 | Roberts | Mar. 12, 1935 |
| 1,999,668 | Smith | Apr. 30, 1935 |
| 2,341,013 | Black | Feb. 8, 1944 |
| 2,426,589 | Bollman | Sept. 2, 1947 |
| 2,572,108 | Chalhoub | Oct. 23, 1951 |
| 2,714,702 | Shockley | Aug. 2, 1955 |
| 2,730,576 | Caruthers | Jan. 10, 1956 |
| 2,808,474 | Maynard et al. | Oct. 1, 1957 |
| 2,833,870 | Wilhelmsen | May 6, 1958 |